US012804896B2

(12) United States Patent
Lee et al.

(10) Patent No.: US 12,804,896 B2
(45) Date of Patent: Nov. 17, 2026

(54) NON-VOLATILE MEMORY HAVING L SHAPED DIELECTRIC LAYER

(71) Applicant: UNITED MICROELECTRONICS CORP., Hsin-Chu City (TW)

(72) Inventors: Kuo-Hsing Lee, Hsinchu County (TW); Chun-Hsien Lin, Tainan City (TW); Chih-Kai Kang, Tainan City (TW); Ting-Hsiang Huang, Tainan City (TW); Chien-Liang Wu, Tainan City (TW); Sheng-Yuan Hsueh, Tainan City (TW); Chi-Horn Pai, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 799 days.

(21) Appl. No.: 17/844,076

(22) Filed: Jun. 20, 2022

(65) Prior Publication Data

US 2023/0380148 A1 Nov. 23, 2023

(30) Foreign Application Priority Data

May 18, 2022 (CN) ......................... 202210544368.9

(51) Int. Cl.
*H10B 20/20* (2023.01)
*H10B 20/25* (2023.01)
*H10W 10/00* (2026.01)
*H10W 10/17* (2026.01)

(52) U.S. Cl.
CPC ............. *H10B 20/20* (2023.02); *H10B 20/25* (2023.02); *H10W 10/014* (2026.01); *H10W 10/17* (2026.01)

(58) Field of Classification Search
CPC .... H10B 20/20; H10B 20/25; H01L 21/76224
See application file for complete search history.

(56) References Cited

U.S. PATENT DOCUMENTS

| | | | | |
|---|---|---|---|---|
| 6,130,469 | A * | 10/2000 | Bracchitta | H10W 20/491 257/50 |
| 9,589,970 | B1 * | 3/2017 | Tseng | H10B 20/25 |
| 9,659,943 | B1 * | 5/2017 | Tran | H10B 20/20 |
| 2004/0191985 | A1 | 9/2004 | Tu | |
| 2005/0077557 | A1 * | 4/2005 | Chiang | H10B 12/377 257/E21.018 |
| 2006/0172504 | A1 | 8/2006 | Sinitsky | |
| 2010/0052094 | A1 | 3/2010 | Carter | |
| 2012/0195091 | A1 | 8/2012 | Schmitt | |

(Continued)

FOREIGN PATENT DOCUMENTS

| | | | |
|---|---|---|---|
| CN | 1606150 | A | 4/2005 |
| WO | 2007/032067 | A1 | 3/2007 |

*Primary Examiner* — Aaron J Gray
(74) *Attorney, Agent, or Firm* — Winston Hsu

(57) ABSTRACT

A method for fabricating a semiconductor device includes the steps of first providing a substrate having an one time programmable (OTP) device region, forming a shallow trench isolation (STI) in the substrate, forming a first doped region adjacent to the STI, removing part of the STI, and then forming a first gate structure on the substrate and the STI. Preferably, the first gate structure includes a high-k dielectric layer on the substrate and a gate electrode on the high-k dielectric layer, in which the high-k dielectric layer comprises a first L-shape.

9 Claims, 7 Drawing Sheets

(56) References Cited

U.S. PATENT DOCUMENTS

| | | | | |
|---|---|---|---|---|
| 2015/0123209 | A1* | 5/2015 | Choi | H10B 20/25 257/379 |
| 2018/0033795 | A1 | 2/2018 | Horch | |
| 2020/0295161 | A1 | 9/2020 | Toh | |

* cited by examiner

NON-VOLATILE MEMORY HAVING L SHAPED DIELECTRIC LAYER

BACKGROUND OF THE INVENTION

1. Field of the Invention

The invention relates to a method for fabricating semiconductor device, and more particularly to a method for fabricating an one-time programmable (OTP) device.

2. Description of the Prior Art

Semiconductor memory devices including non-volatile memory devices have been widely used in various electronic devices such as cellular phones, digital cameras, personal digital assistants (PDAs), and other applications. Typically, non-volatile memory devices include multi-time programmable (MTP) memory devices and one-time programmable (OTP) memory devices. In contrast to rewritable memories, OTP memory devices have the advantage of low fabrication cost and easy storage. However, OTP memory devices could only perform a single data recording action such that when certain memory cells of a destined storage block were stored with a writing program, those memory cells could not be written again.

Since current OTP memory devices still have the disadvantage of weak reading current and longer stress time under program mode, how to improve the current architecture for OTP memory devices has become an important task in this field.

SUMMARY OF THE INVENTION

According to an embodiment of the present invention, a method for fabricating a semiconductor device includes the steps of first providing a substrate having an one time programmable (OTP) device region, forming a shallow trench isolation (STI) in the substrate, forming a first doped region adjacent to the STI, removing part of the STI, and then forming a first gate structure on the substrate and the STI. Preferably, the first gate structure includes a high-k dielectric layer on the substrate and a gate electrode on the high-k dielectric layer, in which the high-k dielectric layer comprises a first L-shape.

According to another aspect of the present invention, a semiconductor device includes a substrate having an one time programmable (OTP) memory region, a shallow trench isolation (STI) in the substrate, a first doped region adjacent to the STI, and a first gate structure on the substrate and the STI. Preferably, the first gate structure includes a high-k dielectric layer on the substrate as the high-k dielectric layer having a first L-shape and a gate electrode on the high-k dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
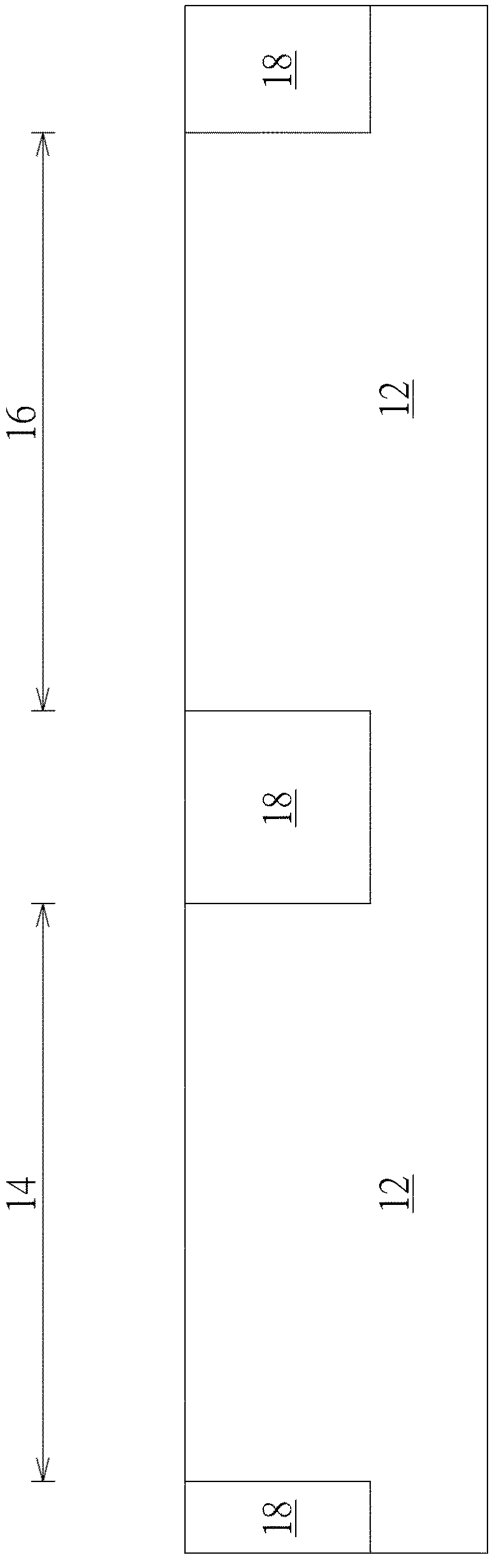
FIGS. 1-9 illustrate a method for fabricating a semiconductor device according to an embodiment of the present invention.

Referring to FIGS. 1-9, FIGS. 1-9 illustrate a method for fabricating a semiconductor device according to an embodiment of the present invention. As shown in FIG. 1, a substrate 12 such as a silicon substrate or silicon-on-insulator (SOI) substrate is provided and a core region 14 and an one time programmable (OTP) device region 16 are defined on the substrate 12, in which the OTP device region 16 could further include a cell region (not shown) and a periphery region (not shown). Next, a shallow trench isolation (STI) 18 is formed in the substrate 12 to divide the aforementioned regions and an ion implantation process could be conducted to implant p-type dopants into the substrate 12 for forming p-wells in each of the above regions in the substrate 12. In this embodiment, the core region 14 is defined to fabricate metal-oxide semiconductor (MOS) transistors in the later process while the OTP region 16 is defined to fabricate an integrated structure of MOS transistors and OTP capacitors.

Figure 2:
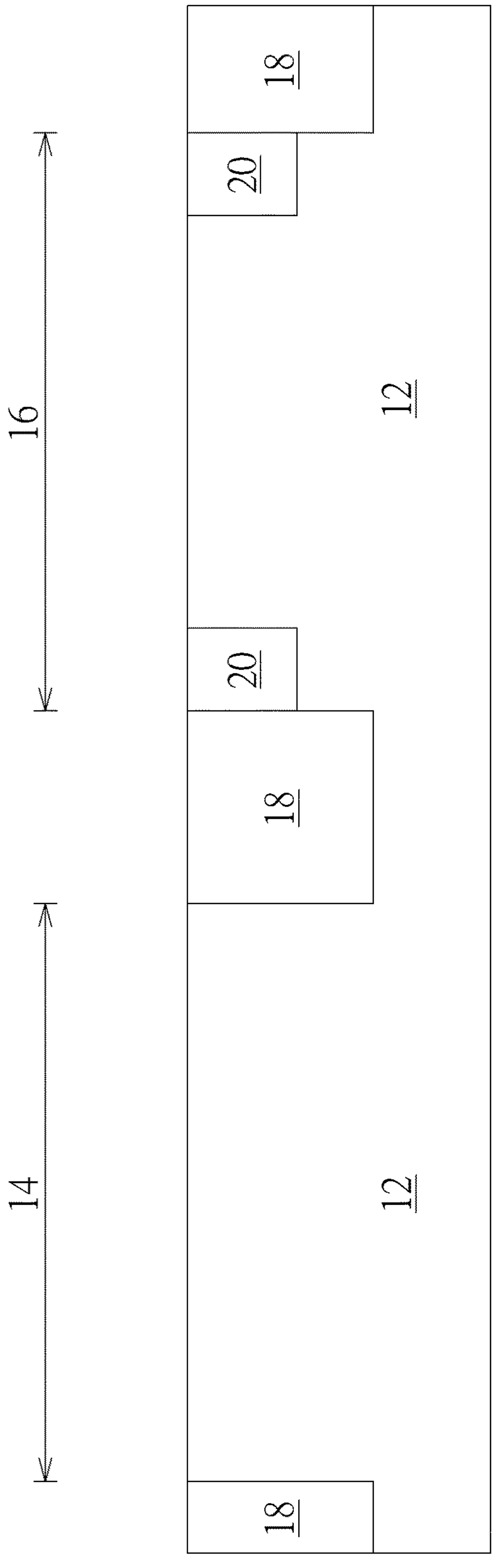

Next, as shown in FIG. 2, another ion implantation process is conducted to implant dopants opposite to that of the well region such as n-type dopants into the substrate 12 on the OTP device region 16 for forming at least a doped region 20 or doped regions 20 adjacent to the STI 18. In this embodiment, the top surface of the doped regions 20 is even with the top surface of the STI 18 while the bottom surface of the doped regions 20 is slightly higher than the bottom surface of the STI 18.

Figure 3:
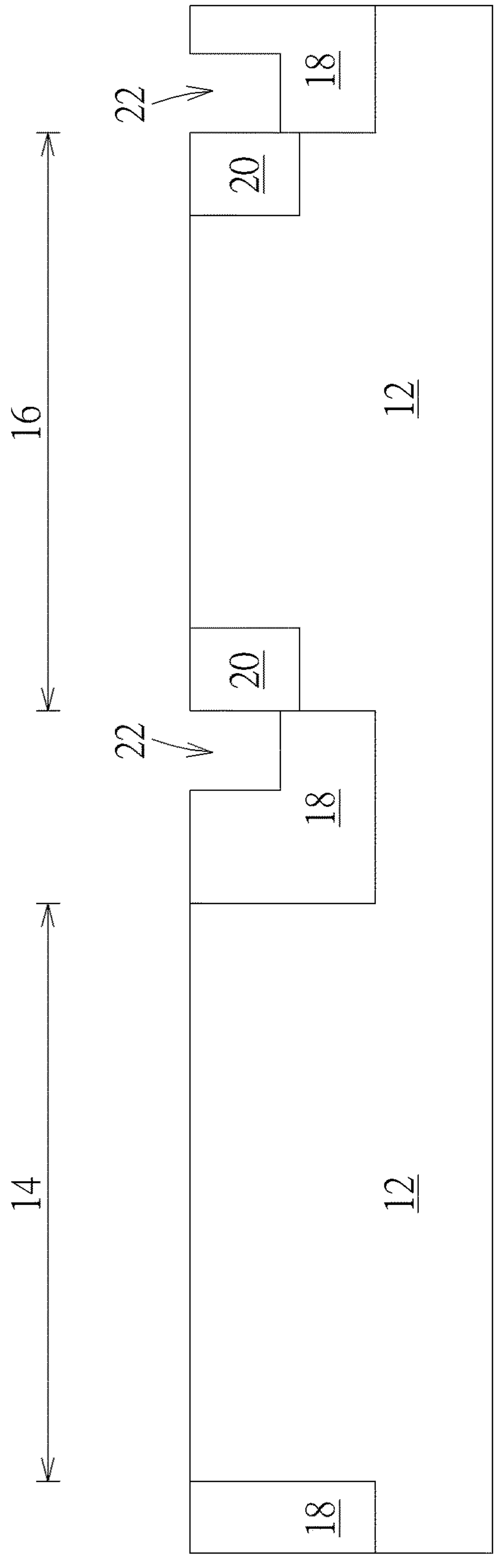

Next, as shown in FIG. 3, a photo-etching process is conducted to remove part of the STI 18 immediately adjacent to the substrate 12 of OTP device region 16 for forming a recess 22 or recesses 22 while the STI 18 immediately adjacent to the substrate 12 on the core region 14 is not removed at all. In this embodiment, the bottom surface of each recess 22 is slightly higher than the bottom surface of the adjacent doped region 20.

Figure 4:
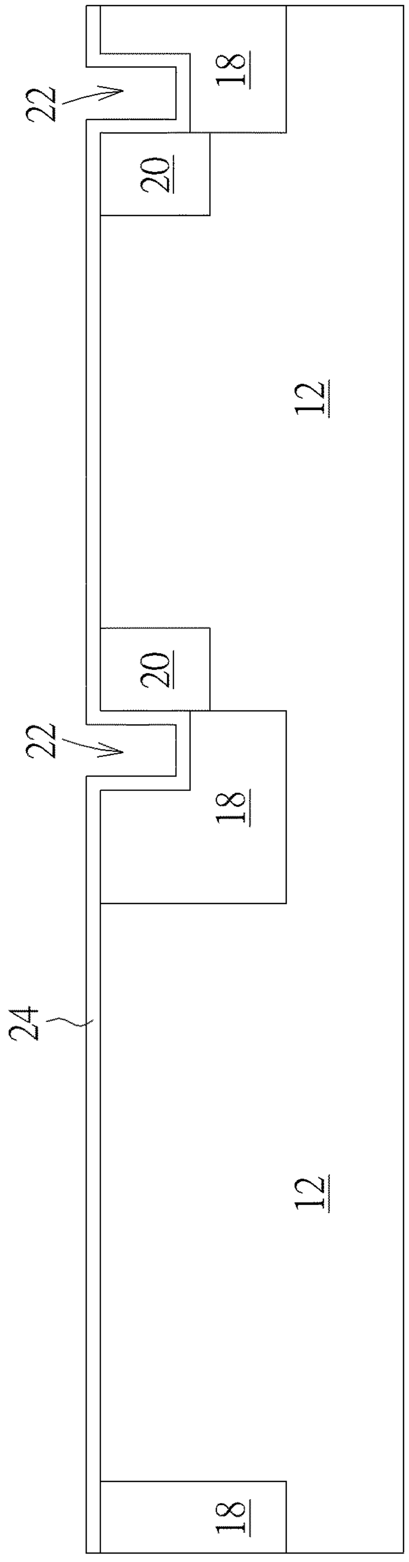

Next, as shown in FIG. 4, a high-k dielectric layer 24 is formed on the substrate 12 on both core region 14 and OTP device region 16 as the high-k dielectric layer 24 is disposed to cover the top surface of the substrate on the core region 14 and top surface and sidewall of the substrate 12 on the OTP device region 16. Preferably, the high-k dielectric layer 24 is deposited into the recesses 22 while not filling the recesses 22 completely as the high-k dielectric layer 24 is formed on the top surface and sidewall of the STI 18.

In this embodiment, the high-k dielectric layer 24 is preferably selected from dielectric materials having dielectric constant (k value) larger than 4. For instance, the high-k dielectric layer 24 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Figure 5:
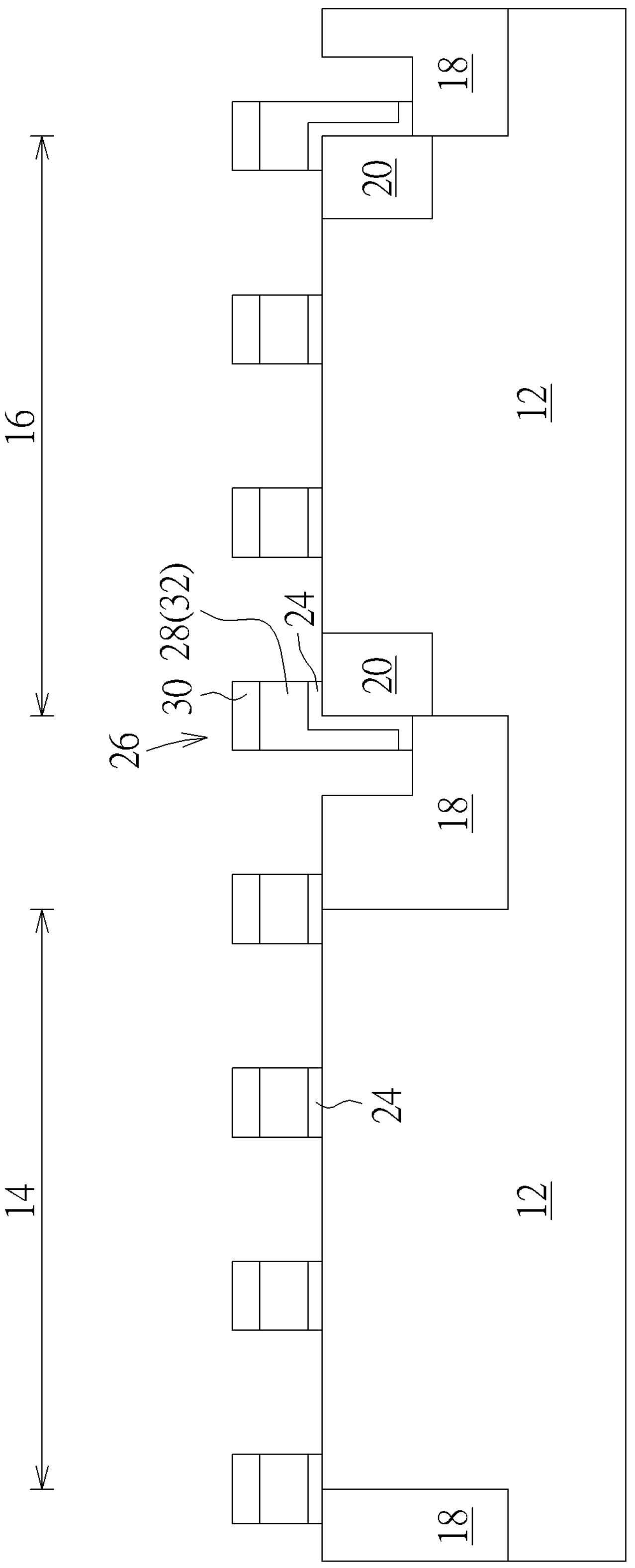

Next, as shown in FIG. 5, a plurality of gate structures 26 are formed on the substrate 12. In this embodiment, the formation of the gate structures 26 could be accomplished by a high-k first approach from gate last process. For instance, a gate material layer 28 made of polysilicon and a selective hard mask 30 could be formed sequentially on the high-k dielectric layer 24, and a pattern transfer process is then conducted by using a patterned resist (not shown) as mask to remove part of the hard mask 30, part of the gate material layer 28, and part of the high-k dielectric layer 24 through single or multiple etching processes. After stripping the patterned resist, gate structures 26 each composed of a patterned high-k dielectric layer 24, a patterned gate material layer 28, and a patterned hard mask 30 are formed on the substrate 12, in which the patterned gate material layer 28 preferably serves a gate electrode 32 for each gate structure.

It should be noted that even though the high-k dielectric layer 24 is directly formed on the surface of the substrate 12, according to an embodiment of the present invention it would also be desirable to first form a gate dielectric layer (not shown) or interfacial layer made of silicon oxide, silicon oxynitride (SiON), silicon oxycarbide (SiOC), or silicon oxyfluoride (SiOF) on the surface of the substrate 12, and then form the high-k dielectric layer 24, the gate material layer 28, and the hard mask 30 on the gate dielectric layer, which is also within the scope of the present invention.

Figure 6:
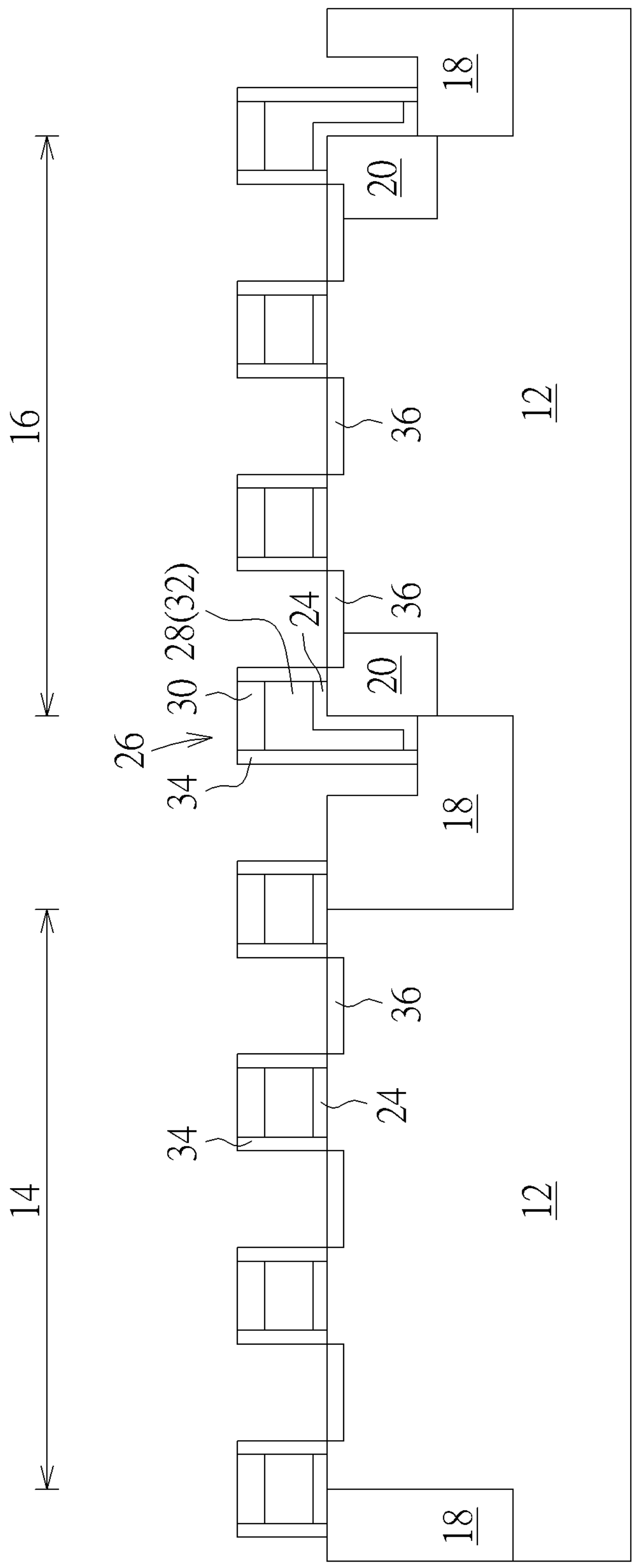

Next, as shown in FIG. 6, at least a spacer 34 is formed on the sidewalls of each of the gate structures 26 and then doped regions 36 or source/drain regions are formed in the substrate 12 adjacent to one side or two sides of the gate structures 26. In this embodiment, the spacer 34 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The doped region 36 or source/drain regions could include n-type dopants or p-type dopants depending on the type of device being fabricated. For instance, each of the doped region 36 in this embodiment preferably includes n-type dopants, but not limited thereto.

It should be noted that the doped region 36 formed at this stage and the doped region 20 formed immediately adjacent to the STI 18 are preferably made of same conductive type, the concentration of the doped region 20 is slightly less than the concentration of the doped region 36, the doped region 36 preferably overlaps and contacts the doped region 20 directly, the top surface of the doped region 20 is even with the top surface of the doped region 36, and the depth of the doped region 20 is approximately more than two times including three times, four times, or even five times the depth of the doped region 36.

Figure 7:
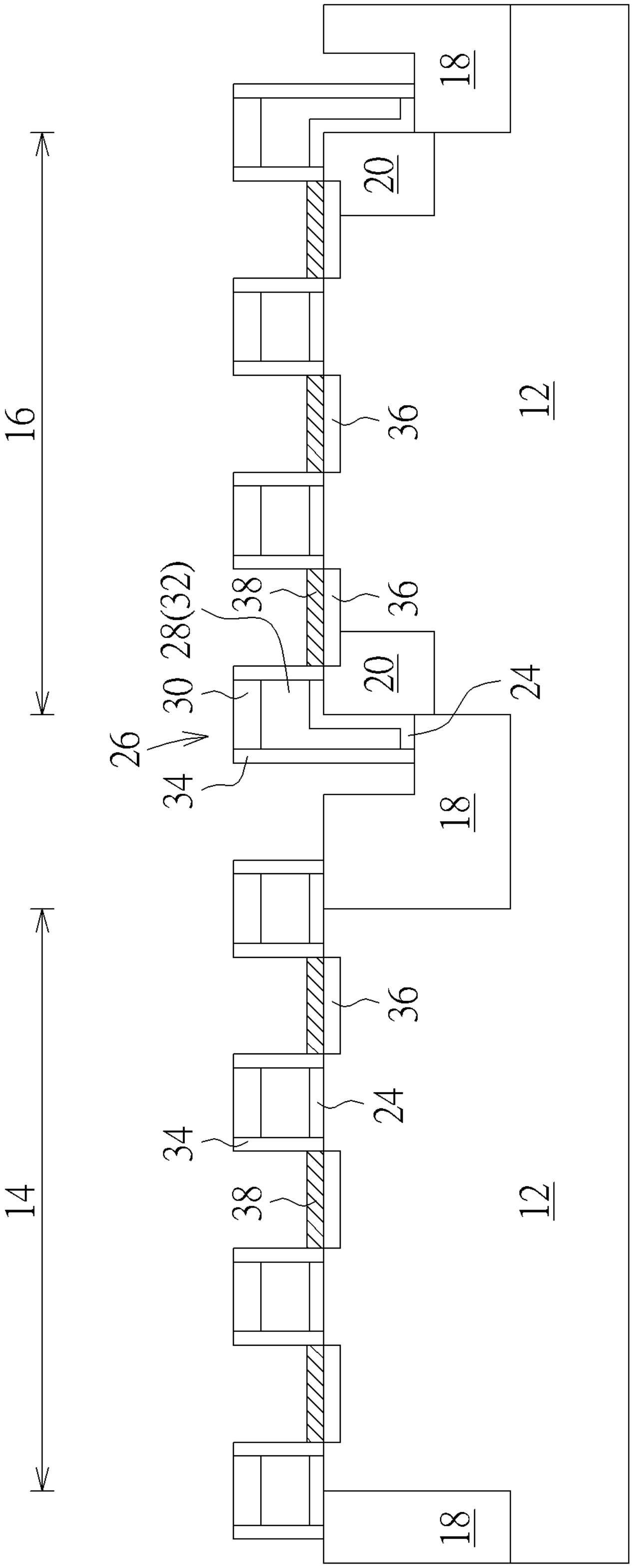

Next, as shown in FIG. 7, a salicide process is conducted to form a silicide 38 on the surface of the substrate 12 adjacent to two sides of the gate structures 26.

Figure 8:
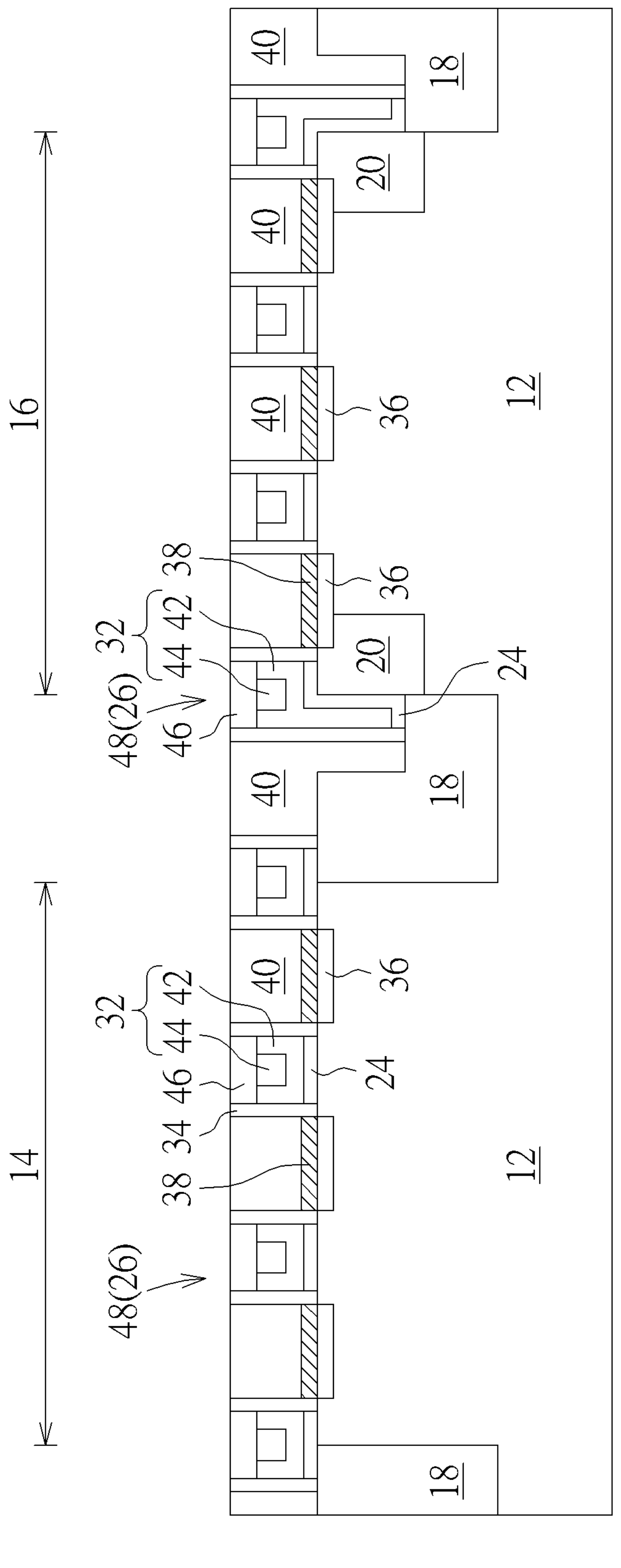

Next, as shown in FIG. 8, an interlayer dielectric (ILD) layer 40 made of silicon oxide is formed on the gate structures 26 and the STI 18, and a planarizing process such as chemical mechanical polishing (CMP) process is conducted to remove part of the ILD layer 40 for exposing the hard masks 30. Next, a replacement metal gate (RMG) process is conducted to transform the gate structures 26 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the hard masks 30 and the gate material layers 28 from gate structures 26 for forming recesses (not shown) in the ILD layer 40.

Next, conductive layers including a work function metal layer 42 and a low resistance metal layer 44 are formed in the recesses, and a planarizing process such as CMP is conducted to remove part of low resistance metal layer 44 and part of work function metal layer 42 so that the top surfaces of the U-shape work function metal layer 42, the low resistance metal layer 44, and the ILD layer 40 are coplanar. Preferably, the work function metal layer 42 and the low resistance metal layer 44 altogether constitute a gate electrode for each of the transistors or devices.

In this embodiment, the work function metal layer 42 is formed for tuning the work function of the metal gate in accordance with the conductivity of the device. For an NMOS transistor, the work function metal layer 42 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 42 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 42 and the low resistance metal layer 44 may include titanium (Ti), titanium nitride (TiN), tantalum (Ta) or tantalum nitride (TaN). Furthermore, the material of the low-resistance metal layer 44 may include copper (Cu), aluminum (Al), titanium aluminum (TiAl), cobalt tungsten phosphide (CoWP) or any combination thereof. Since the transformation of dummy gates into metal gates through RMG process is well known to those skilled in the art, the details of which are not explained herein for the sake of brevity. Next, part of the work function metal layer 42 and part of the low resistance metal layer 44 are removed to form recesses (not shown), and a hard mask 46 is formed into each of the recesses so that the top surfaces of the hard masks 46 and the ILD layer 40 are coplanar. Preferably the hard masks 46 could include $SiO_2$, SiN, SiON, SiCN, or combination thereof.

Figure 9:
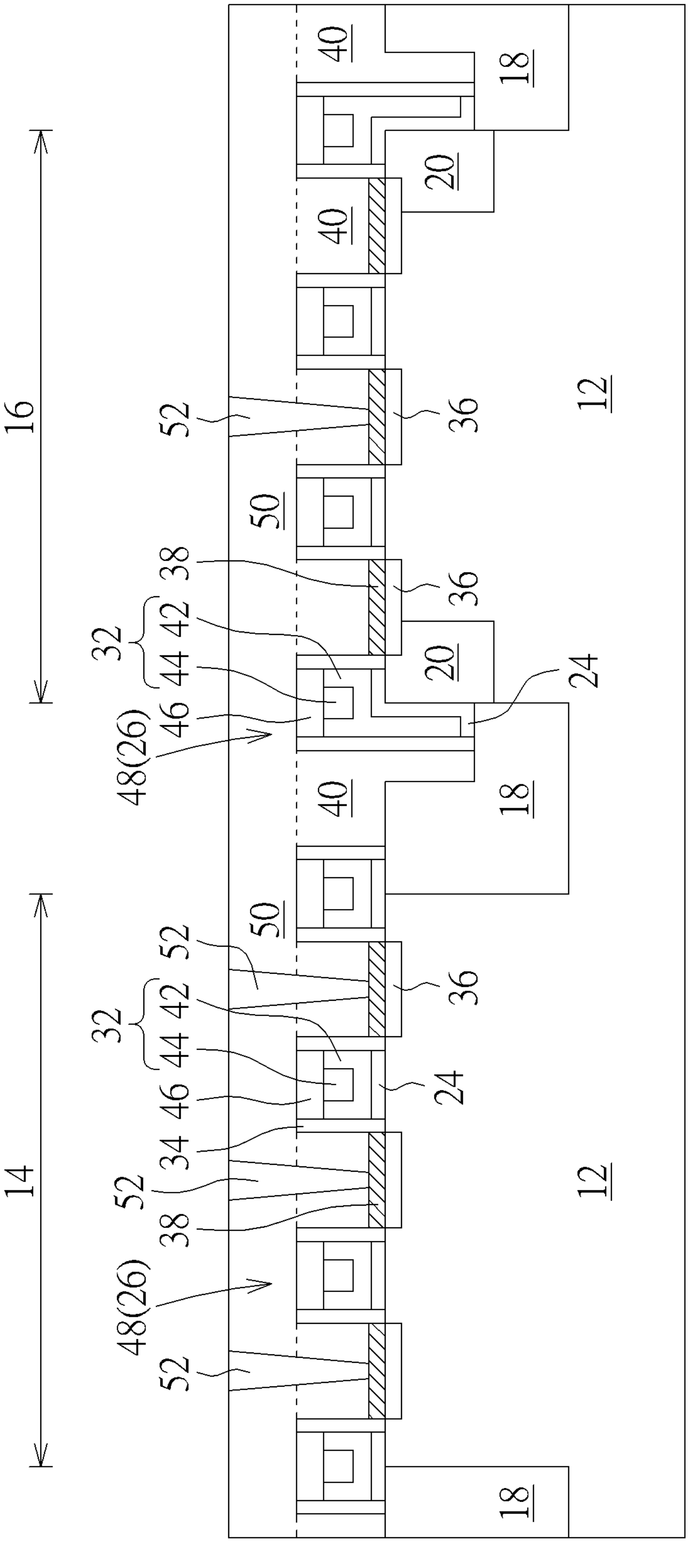

Next, as shown in FIG. 9, another ILD layer 50 could be formed on the gate structures 26 and ILD layer 40 and a photo-etching process is conducted by using a patterned mask (not shown) as mask to remove part of the ILD layers 40, 50 adjacent to the gate structures 26 for forming contact holes (not shown) exposing the doped regions 36 or silicides 38. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned barrier layer and low resistance metal layer for forming contact plugs 52 electrically connecting the doped regions 36 or silicides 38. In this embodiment, the gate structures 26 on two adjacent sides on the OTP device region 16 are preferably connected to source lines, the two gate structures 26 in the middle are connected to word lines, and the contact plug between the two gate structures 26 in the middle is connected to bit line. This completes the fabrication of a semiconductor device according to an embodiment of the present invention.

Referring again to FIG. 9, FIG. 9 illustrates a structural view of a semiconductor device according to an embodiment of the present invention. As shown in FIG. 9, the semiconductor device includes a plurality of active devices such as planar MOS transistors disposed on the core region 14, a plurality of active devices and vertical OTP capacitors disposed on the OTP device region 16, and a STI 18 disposed in the substrate 12 to surround the core region 14 and OTP device region 16. Since the present invention pertains to an integration of active device and vertical OTP capacitors, the STI 18 between the core region 14 and the OTP device region 16 could be partially removed to support the gate structure 26 of the vertical OTP capacitor as the STI 18 between the core region 14 and OTP device region 16 includes a L-shape cross-section.

In this embodiment, the active devices on the OTP device region 16 could include the two gate structures 26 in the middle and doped regions 36 adjacent to two sides of the two gate structures 26 serving as source/drain regions. The vertical OTP capacitor on the other hand includes the two gate structures 26 immediately adjacent to the STI 18 on two adjacent sides and the doped regions 20 in the substrate 12 directly under each of the gate structures 26. Preferably, the gate electrode 32 of each of the gate structures 26 including a work function metal layer 42 and a low resistance metal layer 44 could be serving as a capacitor top electrode for the vertical OTP capacitor, the high-k dielectric layer 24 could be a capacitor dielectric layer, and the doped region 20 could be a capacitor bottom electrode.

Viewing from a more detailed perspective, the gate structure 26 of each vertical OTP capacitor is disposed on the STI 18 and the substrate 12 at the same time, in which the high-k dielectric layer 24 in the gate structure 26 includes a first L-shape directly contacting the top surface and sidewall of the substrate 12 and a second L-shape directly contacting the sidewall of the substrate 12 and a top surface of the STI 18. It should be noted that since the present invention employs a high-k first approach for fabricating the metal gate 48, the high-k dielectric layer 24 preferably includes an I-shape or two L-shapes instead of an U-shape having high-k dielectric layer extending upward as typically found in high-k last approach. Moreover, the doped region 20 in the substrate 12 directly under the gate structure 26 is disposed immediately adjacent to and contacting the doped region 36, the doped regions 20, 36 both include same conductive type, the concentration of the doped region 20 is less than the concentration of the doped region 36, and the doped region 20 contacts the high-k dielectric layer 24 and the STI 18 directly.

Overall, the present invention employs an approach of using planar type field effect transistor (FET) technique for implementing vertical OTP capacitor, in which the vertical OTP capacitor standing on the substrate 12 and the STI 18 shown in FIG. 9 preferably includes a high-k dielectric layer 24 disposed on the substrate 12, a gate electrode 32 made of work function metal layer 42 and low resistance metal layer 44 on the high-k dielectric layer 24, and a doped region 20 disposed directly under the gate electrode 32. Preferably, the high-k dielectric layer 24 includes a first L-shape directly contacting the top surface and sidewall of the substrate 12 and a second L-shape directly contacting the sidewall of the substrate 12 and a top surface of the STI 18. By using a planar FET approach for fabricating vertical OTP capacitor, it would be desirable to improve the programming efficiency of the device significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
- a substrate having an one time programmable (OTP) device region;
- a shallow trench isolation (STI) in the substrate, wherein the STI comprises a L-shape having a vertical portion connected to a horizontal portion;
- a first doped region adjacent to the STI;
- a first gate structure on the substrate and the horizontal portion of the STI, wherein the first gate structure comprises:
  - a high-k dielectric layer on the substrate, wherein the high-k dielectric layer comprises a first L-shape; and
  - a gate electrode on the high-k dielectric layer;
- a first spacer adjacent to one side of the first gate structure, wherein a first sidewall of the first gate structure directly contacting the first spacer is directly on the STI;
- a second spacer adjacent to another side of the first gate structure, wherein a second sidewall of the first gate structure directly contacting the second spacer is directly on the first doped region;
- a second gate structure adjacent to the first gate structure;
- a third spacer adjacent to the second gate structure; and
- a second doped region between the first gate structure and the second gate structure, wherein sidewalls of the second doped region are aligned with sidewalls of the second spacer and the third spacer.

2. The semiconductor device of claim 1, further comprising:
- an interlayer dielectric (ILD) layer around the first gate structure and the second gate structure.

3. The semiconductor device of claim 1, wherein the first doped region contacts the second doped region directly.

4. The semiconductor device of claim 1, wherein the first doped region and the second doped region comprise same conductive type.

5. The semiconductor device of claim 1, wherein a concentration of the first doped region is less than a concentration of the second doped region.

6. The semiconductor device of claim 1, wherein the first doped region contacts the high-k dielectric layer directly.

7. The semiconductor device of claim 1, wherein the first L-shape contacts a top surface and a sidewall of the substrate.

8. The semiconductor device of claim 1, wherein the high-k dielectric layer comprises a second L-shape.

9. The semiconductor device of claim 8, wherein the second L-shape contacts a sidewall of the substrate and a top surface of the STI.

* * * * *